United States Patent
Jeter et al.

(10) Patent No.: US 11,217,285 B1
(45) Date of Patent: Jan. 4, 2022

(54) MEMORY SUBSYSTEM CALIBRATION USING SUBSTITUTE RESULTS

(71) Applicant: Apple Inc., Cupertino, CA (US)

(72) Inventors: Robert E. Jeter, Santa Clara, CA (US); Rakesh L. Notani, Santa Clara, CA (US); Kai Lun Hsiung, Fremont, CA (US); Venkata Ramana Malladi, Santa Clara, CA (US); Rahul Ranjan, Clara, CA (US); Naveen Kumar Korada, Pleasanton, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/986,116

(22) Filed: Aug. 5, 2020

(51) Int. Cl.
  *G11C 7/22* (2006.01)
  *G11C 7/10* (2006.01)
  *G06F 11/10* (2006.01)

(52) U.S. Cl.
  CPC ............ *G11C 7/22* (2013.01); *G06F 11/1076* (2013.01); *G11C 7/10* (2013.01); *G11C 2207/2254* (2013.01)

(58) Field of Classification Search
  CPC ..... G11C 7/22; G11C 7/10; G11C 2207/2254; G06F 11/1076
  USPC ........................................................ 711/104
  See application file for complete search history.

(56) References Cited

U.S. PATENT DOCUMENTS

| | | | |
|---|---|---|---|
| 9,640,244 B1* | 5/2017 | Jeter | G11C 29/028 |
| 10,169,262 B2 | 1/2019 | West et al. | |
| 10,242,723 B1* | 3/2019 | Jeter | G11C 29/028 |
| 10,552,169 B2* | 2/2020 | Madpur | G06F 1/04 |
| 10,572,183 B2 | 2/2020 | Arora et al. | |
| 2008/0056415 A1* | 3/2008 | Chang | H03L 7/00 375/349 |
| 2020/0027503 A1 | 1/2020 | Chen et al. | |
| 2020/0133505 A1 | 4/2020 | Kim | |

* cited by examiner

*Primary Examiner* — Huan Hoang
*Assistant Examiner* — Minh Dinh
(74) *Attorney, Agent, or Firm* — Kowert, Hood, Munyon, Rankin & Goetzel, P.C.; Erik A. Heter

(57) ABSTRACT

A memory subsystem and method for performing calibrations therein is disclosed. A memory subsystem includes a memory controller coupled to a memory by a plurality of signal paths. The memory controller is configured to perform an initial calibration to determine respective eye patterns corresponding to the ones of the plurality of signal paths. For a subsequent calibrations, updated eye patterns are determined for a subset of the plurality of signal paths. Remaining ones of the plurality of signal paths (not included in the subset), are not active during the subsequent calibrations. Updated eye patterns for the remaining ones of the plurality of signal paths are determined based on information obtained during the initial calibration and information from signal paths in the subset designated proxies for the remaining ones of the plurality of signal paths.

20 Claims, 6 Drawing Sheets

- For Initial Calibration, Activate All Signal Paths
- For Subsequent Calibrations, Paths 8 and 9 not Active. Instead Use Results from Selected Ones of Paths 0-7 as a Basis for Paths 8 and 9

MEMORY SUBSYSTEM CALIBRATION USING SUBSTITUTE RESULTS

BACKGROUND

Technical Field

This disclosure is directed to memory subsystems, and more particularly, to performing calibrations in memory subsystems.

Description of the Related Art

Eye patterns, or eye diagrams, are graphic illustrations that illustrate times and amplitudes at which a digital signal can be sampled at its correct value. In various types of systems that include data transmissions, it is desirable to sample signals (e.g., data signals synchronized by a clock signal) near a center of an eye, in terms of time and sampling voltage. In terms of timing, this can provide a signal with a sufficient amount of both setup and hold time, while also rendering it less susceptible to noise. In terms of voltage, this can enable a more accurate determination of a logic value (e.g., logic one or logic zero) based on a threshold voltage used to distinguish one from the other.

In memory subsystems, calibrations may be performed to determine the points at which signals are sampled within the eye pattern. Calibrations are performed to determine an eye diagram that enables accurate sampling of signals, and thus include calibrations based both on the timing (sometimes referred to as a horizontal calibration) and sampling threshold voltage (sometimes referred to as a vertical calibration). Performing these calibrations typically includes adjusting a number of different parameters that govern transmission of data between a memory controller and a memory. Such calibrations may be performed during a system startup, and may also be performed on a periodic basis thereafter.

SUMMARY

A memory subsystem and method for performing calibrations in the same is disclosed. In one embodiment, a memory controller is coupled to a memory by a plurality of signal paths. The memory controller is configured to perform an initial calibration to determine respective eye patterns corresponding to the various ones of the signal paths. For subsequent calibrations, updated eye patterns are determined for a subset of the plurality of signal paths. Remaining ones of the plurality of signal paths (not included in the subset), are not active during the subsequent calibrations. Updated eye patterns for the remaining ones of the plurality of signal paths are determined based on information obtained during the initial calibration.

In one embodiment, the plurality of signals paths is divided up into first and second subsets. During the initial calibration, the signal paths of at least the first subset are calibrated in a first pass, while at least one signal path of the second subset is calibrated in a second pass. Upon completing the initial calibration, results obtained from calibration of the first subset are compared with results obtained for the second subset. For given ones of the second subset, a signal path of the first subset is chosen to be a proxy. A signal path of the first subset is chosen to be a proxy of a corresponding signal path of the second subset based on its calibration results being a closest match relative to other signal paths of the first subset. Differences (e.g., voltage and timing offsets) between the given signal path of the second subset and its chosen proxy are also determined. In subsequent calibrations, only signal paths of the first subset are activated and directly calibrated (e.g., active during the calibration), with their eye patterns updated accordingly. An updated eye pattern for the given signal path of the second subset is determined by combining the calibration results (from the subsequent calibration) for its corresponding proxy in the first subset with the differences determined during the initial calibration.

BRIEF DESCRIPTION OF THE DRAWINGS

The following detailed description makes reference to the accompanying drawings, which are now briefly described.

Figure 1:
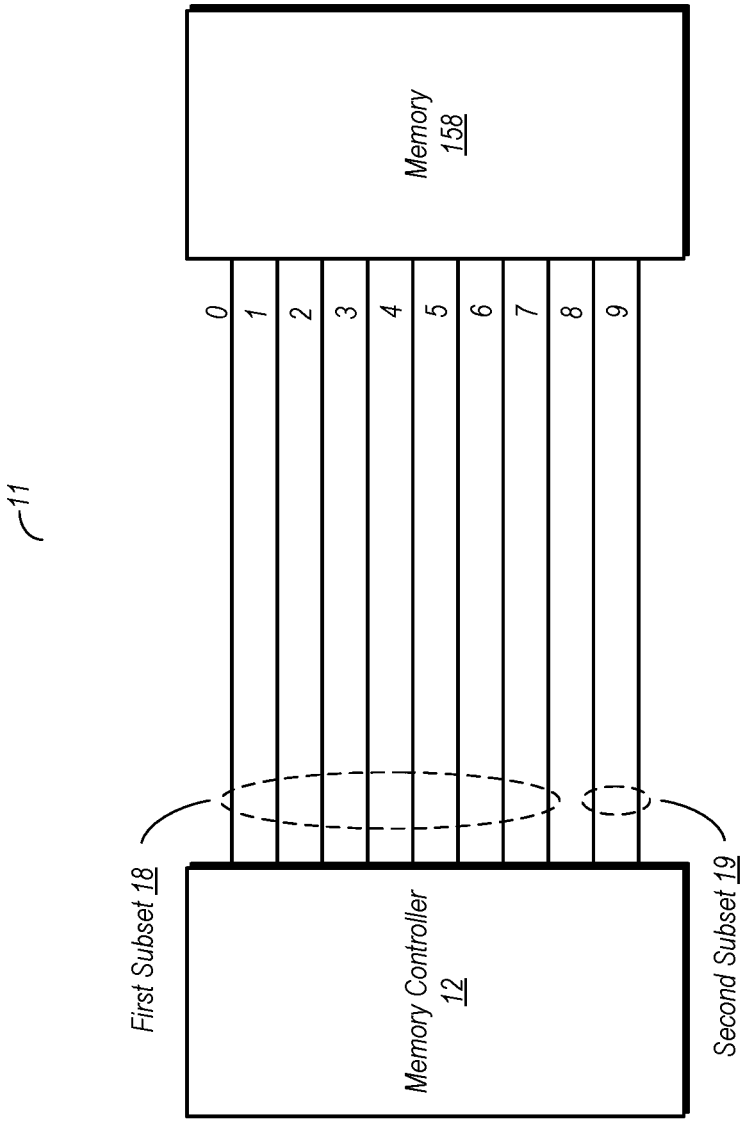
FIG. 1 is a block diagram illustrating one embodiment of a memory subsystem having a memory controller and a memory.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed. FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

Reciting that "the memory controller [is] coupled to the memory by a set of signal paths" and that in an initial calibration includes "activating each of the set of signal paths" means that there are at least two signal paths coupled between the memory controller and the memory that are activated during the initial calibration. In some embodiments, there may be other signal paths coupled between the memory controller and the memory that are not necessarily activated during an initial calibration. In other embodiments, all signal paths coupled between a memory controller and a memory may be activated during an initial calibration. The clause "activating each of the set of signal paths" is thus not to be interpreted that in all cases, all signal paths coupled between the memory controller and the memory are activated during an initial calibration. Instead, it simply provides for the possibility that this might be the case in some instances and not in others.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to the calibration of signal paths coupled between a memory controller and a memory. During the operation of a memory subsystem, calibrations are performed at various times to ensure that the logic values of signals transferred between the memory controller and the memory are properly interpreted upon being received. Proper interpretation of logic values can be achieved by providing sufficient amounts of setup and hold time and determining a voltage that distinguishes between a logic zero and a logic one. Calibration to ensure sufficient setup and hold time for a signal involves adjusting delay amounts provided to a data strobe signal (e.g., a clock signal used to synchronize the transfer and receipt of signals) and determining their respective logical values. Similarly, calibration to determine the distinguishing voltage involves interpreting the logic value of signals at various voltage levels. The former calibration may be referred to as a horizontal calibration while the latter may be referred to as a vertical calibration. Taken together, the horizontal and vertical calibrations may be used to determine what is commonly known as an eye pattern, which represents the range of timing and voltage values at which the logic values of signals may be properly interpreted.

In some memory subsystems, there may be a limit to the number of signal paths that may be calibrated at any given time. However, the total number of signal paths to be calibrated may exceed the number that can be calibrated in a given pass, or instance. Accordingly, in such embodiments, two passes may be required to calibrate all signal paths. If the duration of each calibration pass is substantially the same, the second pass effectively doubles the amount of calibration time, and thus the amount of time the memory system is unavailable. Furthermore, in some memory subsystems, certain signal paths may be inactive for a significant amount of time, with corresponding circuitry powered down. Thus, calibrations of these signal paths may require powering on circuitry and thus negate at least some power savings.

The methodology of the present disclosure for calibration in a memory subsystem is one in which only signal paths of a subset are calibrated for at least some instances of a calibration. An initial calibration is performed in which all signal paths of a particular plurality are calibrated. The plurality of signal paths may be divided into a first subset and a second subset. Results of the initial calibration for signal paths of the first subset are compared with calibration results for signal paths in the second subset. For a given signal path in the second subset, a proxy signal path is selected from among the signal paths of the first subset. The selection is based on the results of the comparisons. More particularly, the proxy signal path of the first subset is selected for having calibration results most closely matching those of its corresponding signal path of the second subset. The differences, or offsets between these two signal paths is also calculated.

For calibrations subsequent to the initial calibration, only signal paths of the first subset are directly calibrated, while those of the second subset may remain inactive. As used herein, the terminology "directly calibrated" in reference to a signal path means that signal path is active during a calibration, and data is gathered based on signals transferred thereon. For each signal path of the second subset, the calibration results of its proxy from the first signal path, along with the calculated offsets, are combined. This effectively results in a calibration, and thus determination of an eye pattern, for each of the signal paths of the second subset without having to perform a two-pass calibration or activate otherwise inactive signal paths. Accordingly, the time that the memory subsystem is unavailable due to calibration may be reduced, while additional power savings may be achieved. Various embodiments of a memory subsystem are now discussed in further detail.

FIG. 1 is a block diagram illustrating one embodiment of a memory subsystem having a memory controller and a memory in a memory subsystem. In the embodiment shown, memory subsystem 11 includes a memory controller 12 and a memory 158. A number of signal paths, in particular signal paths 0-9, are coupled between memory controller 12 and memory 158.

The signal paths as shown may be divided into a first subset 18 and a second subset 19. In this particular embodiment, signal paths 0-7 of first subset 18 are provided for transferring data (for reads and writes) between memory controller 12 and memory 158. Signal paths 8 and 9, of second subset 19 may be provided for various other functions, such as providing one or more error correction code (ECC) bits, signals to perform a data bus inversion (e.g., inverting the values of data on signal paths 0-7), and so on.

In various embodiments, memory controller 12 performs calibrations of the signal paths to determine an eye pattern for each. Calibration may include transfers of data between memory controller 12 and memory 158, including both reads and writes. Although not explicitly shown in FIG. 1, a data strobe signal is conveyed between memory controller 12 and memory 158. The data strobe signal is used to synchronize reads and writes of data transferred over various ones of the signal paths. A calibration includes determining a time at which signals conveyed on ones of the plurality of signal paths are sampled relative to the data strobe signal. Accordingly, the calibration includes providing various delays to the data strobe signal, reading data, and comparing to expected data. Additionally, the voltage levels used to distinguish between a logic one and a logic zero may also be varied during the calibrations. Thus, a calibration includes determining a voltage at which signals conveyed on ones of the plurality of signal paths are used to distinguish a logic one from a logic zero. Based on the comparison results, eye patterns may be determined for each of the signal paths.

In the embodiment shown, memory controller 12 performs an initial calibration that includes activating each of the set of signal paths to determine respective eye patterns for signal paths in the full set. Since memory controller 12 may be limited to calibrating less than the full set of signal paths during a single calibration pass, the initial calibration may include at least two passes. A calibration pass may be defined as a calibration that is performed on a selected group of signal paths. Thus, during the initial calibration, memory controller 12 in the embodiment shown performs a first calibration pass to determine respective eye patterns for signal paths in the subset (e.g., the first subset), and then performs a second calibration pass to determine a respective eye pattern for at least one of the remaining ones of the signal paths (e.g., the second subset). Information obtained during the initial calibration includes, for the remaining ones of the set of signal paths, voltage and timing offsets relative to corresponding selected ones of the first subset of the set of signal paths.

A single calibration pass may include all signal paths of first subset 18 and, in some embodiments, a signal path of second subset 19. For example, consider a situation in which only nine of the ten signal paths can be calibrated during a given pass. Accordingly, signal paths 0-8 may be calibrated during a first pass, while signal path 9 may be calibrated during a second pass. Thus, in the embodiment shown, at least two passes are required to ensure all signal paths are calibrated.

As operating conditions (e.g., temperature) may change over time, memory controller 12 may perform a subsequent calibration that include activating a subset of the set of signal paths to determine updated respective eye patterns for signal paths in the subset. More particularly, in the illustrated embodiment, the signal paths of first subset 18 may be calibrated. For remaining ones of the set of signal paths, respective updated eye patterns may be determined based on information obtained during the initial calibration. Thus, the subsequent calibration is performed without activating the remaining ones of the set of signal paths (e.g., signal paths of second subset 19).

Based on the information obtained during the initial calibration, for each signal path of the second subset 19, a proxy in the first subset 18 is determined. A proxy for a given signal path of the second subset 19 is a signal path in the first subset 18 that provides the basis for updating the eye patterns of the former. More particularly, memory controller 12, in the illustrated embodiment, determines during the first calibration a one of the first subset 18 having an eye pattern most closely matching an eye pattern of a selected one of signal paths of second subset 19. Furthermore, voltage and timing offsets, based on differences in the eye pattern of the one of the first subset 18 and the eye pattern of the second are also determined by memory controller 12.

The selection of a proxy is performed by comparing initial calibration results and computing offset values (e.g., differences). For example, following the initial calibration, the results obtained for signal path 9 (of second subset 19) are compared with each of signal paths 0-7 (of first subset 18). One path from signal paths 0-7 is then selected as a proxy for signal path 9. The selection is based on which signal path of first subset 18 has calibration results that are closest to those of signal path 9 during the initial calibration. During the comparison, offsets are computed. The offsets represent differences, if any, between the calibrated values of signal path 9 and its selected proxy from among signal paths 0-7. During the subsequent calibrations, signal path 9, being part of second subset 19, is not directly calibrated. Instead, the subsequent calibration values for its selected proxy are combined with the offset to obtain signal path 9's updated calibration values (and thus, updated eye pattern). This same process may be performed for signal path 8 (also of second subset 19), and more generally, for any signal path in a second subset of a given embodiment. It is possible in some instances that two signal paths of a second subset may have the same proxy within a first subset, although this is not necessarily always the case.

In some embodiments, calibrations may be performed at a number of different clock frequencies, as memory subsystem 11 may undergo performance state changes during operation due to, e.g., workload demands, power demands, and so on. Accordingly, in such embodiments, memory controller 12 selects a first one of the subset of signals paths as a basis for determining an eye pattern for subsequent calibrations conducted at a first clock frequency, and further selects a second one of the subset of signal paths as a basis for determining an eye pattern for subsequent calibrations conducted at a second clock frequency.

Memory controller 12 in one embodiment performs the initial calibration during a startup of a system in which memory controller 12 and memory 158 are implemented. Memory controller 12 also performs one or more instances of the subsequent calibration during operation of the system. In some embodiments, these subsequent calibrations may be performed periodically. As initial calibrations may be performed for a number of different clock frequencies, the subsequent calibrations may also be performed when the clock frequency is changed.

For both the initial and subsequent calibrations, memory controller 12 performs one or more writes of data to memory 158 and also performs one or more reads of data from memory 158. As noted above, this also includes comparing data written to and read from memory 158 to expected values.

The boundaries of the eye pattern for a given signal path can be determined by the point where one or more bits conveyed on the signal path fail to match their expected values. Generally speaking, toward the middle of the eye, bits conveyed on a given signal path will match a corresponding expected value and will have a substantial amount of margin in both timing and voltage. These margins decrease toward the boundaries of the eye.

Figure 2:
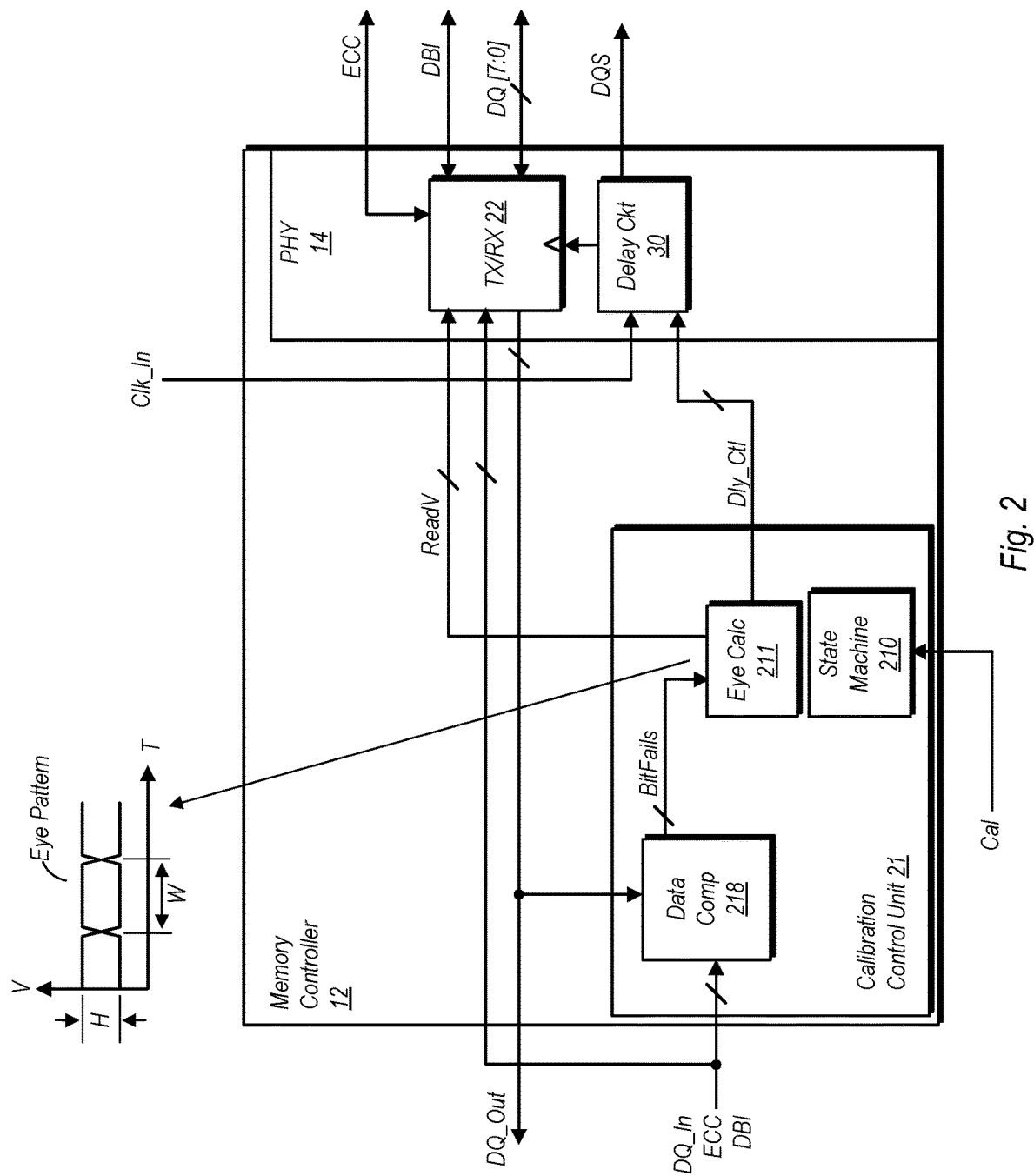
FIG. 2 is a block diagram further illustrating one embodiment of a memory controller.

FIG. 2 is a block diagram illustrating one embodiment of a memory controller. In the embodiment shown, memory controller 12 includes a calibration control unit 21 and a physical interface 14. Calibration control unit 21 in the embodiment shown implements various circuit units, including data comparator 218, eye calculator 211, and a state machine 210. Physical interface 14 implements circuitry for communicating with a memory (not shown here). The circuitry of physical interface 14 includes transceiver 22 and a delay circuit 30.

In the embodiment shown, transceiver 22 of physical interface 14 is coupled to a data bus which includes data signal paths DQ[7:0]. Additionally, an error correction code (ECC) signal path is also coupled to transceiver 22. A data bus inversion (DBI) signal path is coupled to transceiver 22 in this embodiment. A DBI signal, when asserted, may cause all of the bits conveyed in signals conveyed on the data signal paths DQ[7:0] to be inverter, e.g., all logic zeros to be inverted into logic ones. Other signal paths may be present, and the data bus shown here may be implemented with a different number of bits in other embodiments. The signal paths coupled to transceiver 22 in this embodiment may be subject to calibration per the discussion above. It is noted that in other embodiments, additional signal paths may be coupled to transceiver 22, some of which may undergo calibration from time to time. Furthermore, other signals may be conveyed from other circuit units (not explicitly shown here) within physical interface 14. For example, physical interface 14 may include control circuitry to generate write enable and read enable signals that are conveyed to a memory during write and read operations, respectively. Similarly, circuit units for generating address signals may also be included in physical interface 14, but are omitted from FIG. 2 for the sake of simplicity.

During read operations, transceiver 22 may interpret the logic values of signals received from the memory via the signal paths DQ[7:0]. Similarly, transceiver 22 may also determine logic values of an ECC signal and a DBI signal conveyed on their respective signal paths. Transceiver 22 may also include ECC circuitry to correct an erroneous value received during a read operation, and may also include inverter circuits for inverting logical values of signals received via that data bus when a DBI signal is in its asserted state. It is noted that for at least portions of a calibration, the ECC circuitry and the inverter circuits may be temporarily disabled. Transceiver 22 may distinguish between a logic one and a logic zero for a signal received via one of the illustrated signal paths based on a read voltage, ReadV, that is indicated by eye calculator 211.

Delay circuit 30 in the embodiment shown is coupled to receive an input clock signal, Clk_In, provided from a source external to memory controller 12. Although not explicitly shown, delay circuit 30 may include one or more delay locked loops (DLLs) or other type of delay circuitry. Delay may be applied to the input clock signal to generate a data strobe signal, DQS, which is used to synchronize the transfer of other signals (e.g., DQ[7:0]) between a memory and memory controller 12. The amount of delay applied may be based on a delay control signal, Dly_Ctl, provided by eye calculator 211. In addition to conveying the data strobe signal to the memory, delay circuit 30 in the embodiment shown is also coupled to provide a clock signal to transceiver 22.

During calibration operations, the data comparison circuit 218 may receive data that is to be written to the memory via the DQ_In input. This data may then be transferred to the memory from transceiver 22. Data that is read from memory may be received by data comparison circuit 218 from transceiver 22, via the DQ_Out path. Data received from memory may then be compared to data that was written thereto in order to determine if any bit fails occur. A bit fail may be defined herein as a bit corresponding to a signal conveyed on a particular signal path of the data bus not matching its expected value (e.g., read as a logic zero when a logic one is expected). Bit fails may be reported to eye calculation circuit 211. Responsive to receiving information of a bit fail, eye calculation circuit 211 may record the failing bit along with the reference voltage value and the delay value (as applied to the data strobe). Based on the data from failing bits and corresponding reference voltage and delay values, eye calculation circuit 211 may calculate an eye pattern for each bit position, and thus each signal path.

A given calibration operation may include a number of writes of data to memory and a number of reads of data from memory. Over a number of iterations, eye calculator 211 may cause adjustments to both the delay used in generation of the data strobe signal (via the Dly_Ctl signal) and the voltage used to distinguish between a logic one and a logic zero. Performing these operations for a number of different delay values and read voltage values may be used to define the eye pattern for the calibrated signal paths. An example eye pattern is shown in FIG. 2, with its height H defined along the vertical, voltage axis V, while the width W is defined along the time axis T. The voltage axis represents values of the read voltage, while the time axis represents delay values applied in delay circuit 30 during the generation of the data strobe signal. Values within the defined height and width of the eye pattern indicate areas where data bits conveyed in a signal can be correctly interpreted as a logic one or a logic zero. The areas toward the center of the eye pattern generally have a larger amount of timing margin and voltage margin than those located toward the boundaries.

State machine 210 in the embodiment shown is configured to coordinate the calibration operations. Responsive to receiving a calibration signal (Cal) from an external source, state machine 210 may commence calibration operations. The calibration signal may be received from, e.g., a processor, system firmware, or other source. Assertion of the calibration signal may be performed in conjunction with a system startup, at periodic intervals, and in response to changes in a performance state, among other conditions. During calibration operations, state machine 210 may communicate with eye calculator 211, data comparator 218, and transceiver 22. Among the functions that state machine 210 may perform is issuing commands to transmit data for write operations, to cause memory controller 12 to read data from memory, and to cause eye calculator 211 to cause a change to the delay and read voltage values.

Upon completing a given calibration, eye calculator 211 may store the read voltage and delay values (or write voltage and delay values for write calibrations) for each of the calibrated signal paths. These values may then be used to set the read voltage and delay values for normal (e.g., non-calibration) operations. In some embodiments, these values may be set based on an average of calibrated values for the various calibrated signal paths. Embodiments are also possible and contemplated wherein offset information is conveyed with the delay and read voltage values to allow signals to be interpreted for each signal path according to its own, unique eye pattern.

Figure 3:
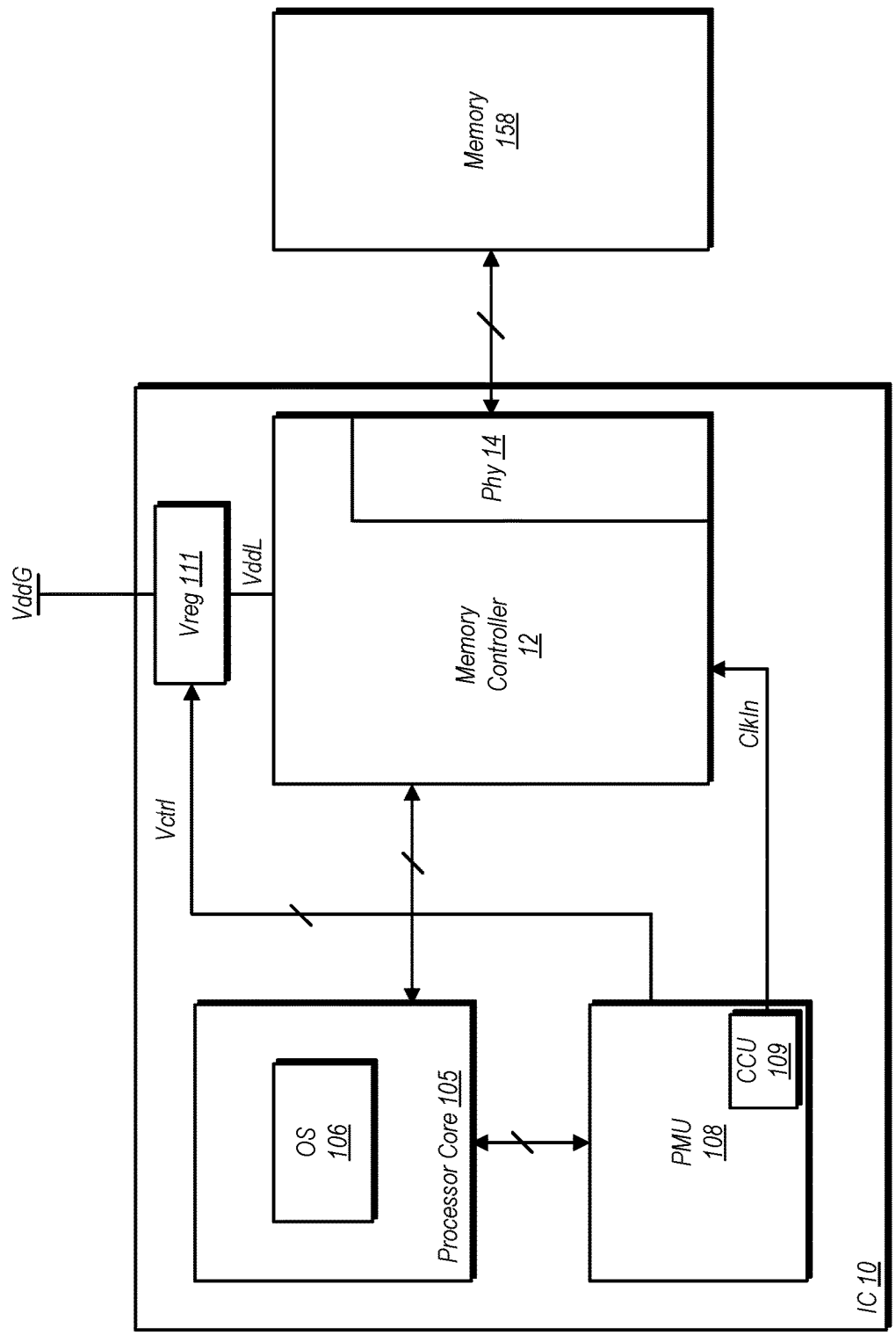
FIG. 3 is a block diagram illustrating one embodiment of a system having an integrated circuit and a memory.

FIG. 3 is a block diagram illustrating one embodiment of a system having an integrated circuit and a memory. In the embodiment shown, integrated circuit 10 includes at least one processor core 105, a power management unit 108, a voltage regulator 11, and memory controller 12. Memory controller 12 in the embodiment shown may be arranged similar to that which was discussed above in reference to FIG. 2. Integrated circuit 10, and more particularly, memory controller 12, is coupled to a memory 158.

Processor core 105 may be a singular processor core implemented on integrated circuit 10 in some embodiments, or may be one of a number of different processor cores in other embodiments. In embodiments having multiple processor cores, the cores may be homogenous or heterogenous. Among other functions, processor core 105 may execute instructions of an operating system 106 to perform various system-level functions. Among these functions may be decisions on when memory controller 12 is to carry out a calibration of various signal paths coupled between integrated circuit 10 and memory 158. Processor core 105 may also execute instructions of various software programs/applications. As shown here, processor core 105 is coupled to memory controller 12, and may send data thereto and receive data therefrom in carrying out its various operations.

Power management unit 108 in the embodiment shown includes various circuits used to carry out various power management functions of the system. Among these functions include the implementation of performance state changes. These performance state changes may include changes to the operating voltage of various circuit units in the system, as well as changing the frequency of a clock signal received by the same. Higher performance may be achieved in some embodiments by increasing a clock frequency, an operating voltage, or both. Similarly, reduction in power consumption may be achieved by reducing an operating voltage and/or reducing a clock frequency. In the embodiment shown, power management unit 108 is configured to generate voltage control signals, Vctrl, which are provided to a voltage regulator 111.

In the embodiment shown, voltage regulator 111 is coupled to receive a global supply voltage, VddG, from an external source, and provide a local supply voltage, VddL, to memory controller 12. Power management unit 108 may cause the local voltage to increase or decrease depending on states of the voltage control signals. Voltage regulator 111 may be any suitable type of circuit for supplying a regulated supply voltage, such as a switching converter (e.g., buck converter, boost converter) or low-dropout (LDO) voltage regulator.

Clock control unit 109 of power management unit 108 may perform various clock control functions. In some embodiments, clock control unit 109 may include circuitry (e.g., a phase-locked loop) for generating a clock signal. In other embodiments, the clock signal may be provided from an external source. Clock control unit 109 may include parameters of the clock signal ClkIn. Such parameters include the frequency of the clock signal, and may also include its duty cycle.

Figure 4:
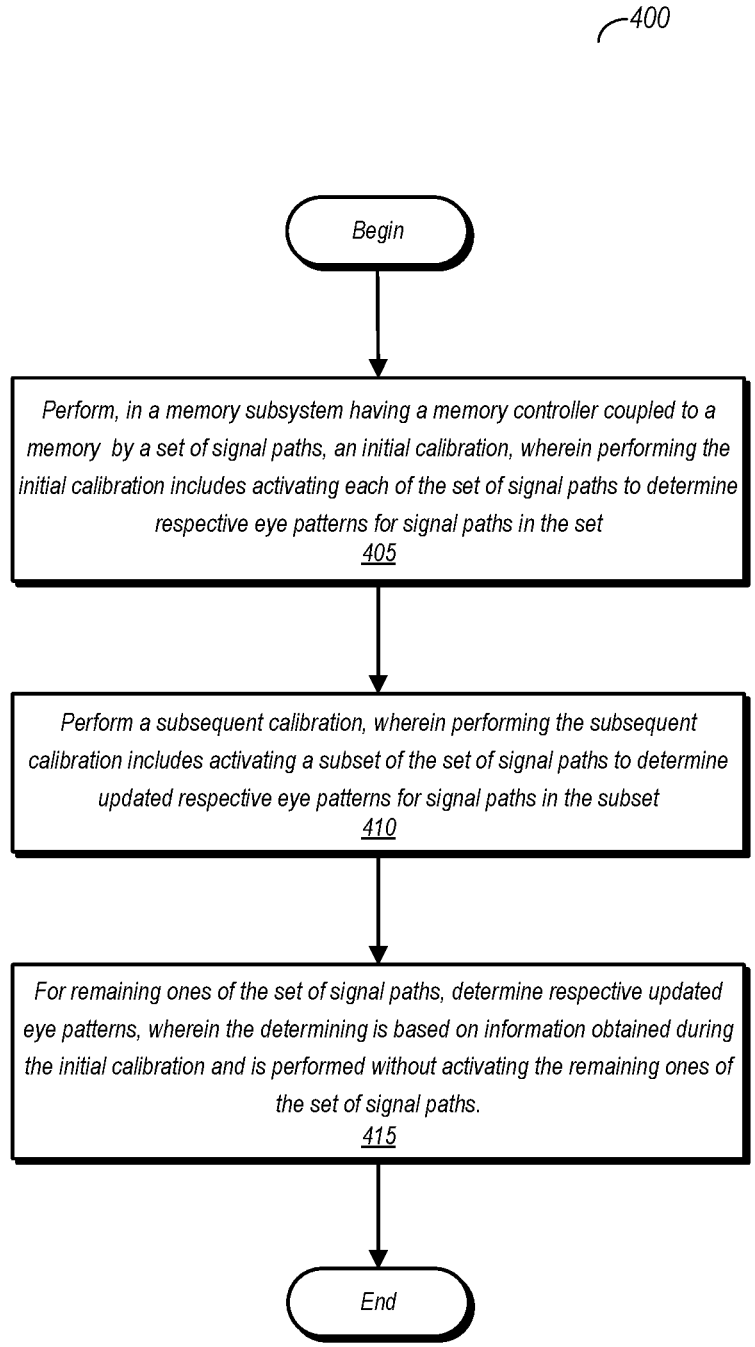
FIG. 4 is a flow diagram illustrating one embodiment of a method for calibrating signal paths coupled between a memory controller and a memory.

FIG. 4 is a flow diagram of one embodiment of a method for calibrating signal paths coupled between a memory controller and a memory. Method 400 as shown herein may be performed on various apparatus embodiments such as those discussed above with reference to FIGS. 1-3. Apparatus embodiments not explicitly discussed herein, but otherwise capable of carrying out Method 400, may also fall within the scope of this disclosure.

Method 400 includes performing, in a memory subsystem having a memory controller coupled to a memory by a set of signal paths, an initial calibration, wherein performing the initial calibration includes activating each of the set of signal paths to determine respective eye patterns for signal paths in the set (block 405). The method further includes performing a subsequent calibration, wherein performing the subsequent calibration includes activating a subset of the set of signal paths to determine updated respective eye patterns for signal paths in the subset (block 410). For remaining ones of the set of signal paths, the method includes determining respective updated eye patterns, wherein the determining is based on information obtained during the initial calibration and is performed without activating the remaining ones of the set of signal paths (block 415).

In various embodiments, the information obtained during the initial calibration includes voltage and timing offsets between a one of the remaining ones of the set of signal paths and one of the subset of the set of signal paths having an eye pattern that most closely matches an eye pattern of the one of the remaining ones of the set of signal paths.

In some embodiments, Method 400 includes determining, during the subsequent calibration, the updated respective eye pattern for the one of the subset of the set of signal paths. Such method embodiments may thus also include computing the respective updated eye pattern for the one of the remaining ones of the set of signal paths by applying the voltage and timing offsets to the updated respective eye pattern for the one of the subset of the set of signal paths. Performing the initial calibration comprises calibrating the subset of signal paths during a first pass and calibrating at least one remaining one of the set of signal paths during a second pass, and wherein performing the subsequent calibration comprises a single pass in which the signal paths of the subset of signal paths are calibrated.

In some embodiments, calibrations may be performed at different clock frequencies, and more generally, in different performance states. In such embodiments, for a subsequent calibration conducted at a first clock frequency, the method includes selecting calibration information for a first one of the subset of signal paths as a basis for determining an a first updated eye pattern for a selected one of the remaining ones of the signal paths. For a subsequent calibration conducted as a second clock frequency different from the first clock frequency, the method includes selecting calibration information for a second one of the subset of signal paths as a basis for determining a first updated eye pattern for the selected one of the remaining ones of the signal paths.

In various embodiments, the method includes performing the initial calibration during a startup of a system implementing the memory subsystem. Thereafter, the method includes performing one or more instances of the subsequent calibration on a periodic basis and performing an instance of the subsequent calibration in response to a performance state change.

Figure 5:
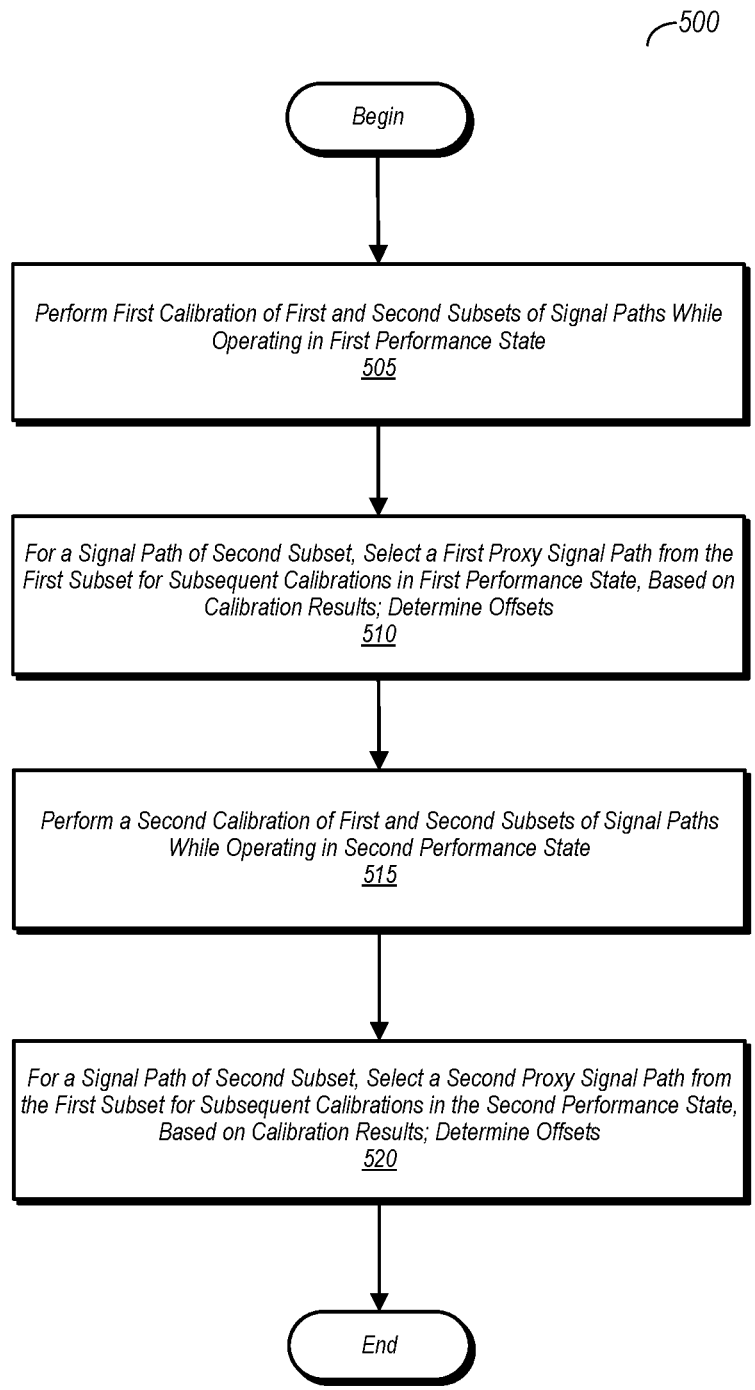
FIG. 5 is a flow diagram of another embodiment of a method for calibrating signal paths coupled between a memory controller and a memory.

FIG. 5 is a flow diagram of another embodiment of a method for calibrating signal paths coupled between a memory controller and a memory of a memory subsystem. Method 500 is directed to an embodiment where calibrations are performed for at least two different performance states, with proxy signal paths being selected from a first subset to provide eye pattern information for signal paths of a second subset. Method 500 may be carried out by the various apparatus embodiments as discussed above. Apparatus embodiments capable of performing Method 500, but otherwise not disclosed herein, may be considered to fall within the scope of this disclosure.

Method 500 includes performing a first calibration of first and second subsets of signal paths while operating in a first performance state (block 505). The first calibration may be an initial calibration performed in that particular performance state, and may be performed during, e.g., a startup of a system in which the memory subsystem is implemented. Based on performance of the first calibration, Method 500 further includes, for a signal path of the second subset, selecting a first proxy signal path from the first subset for subsequent calibrations in the first performance state, based on calibration results, and determining offsets (block 510). The proxy signal path of the first subset is selected based on having calibration results that most closely match, relative to other signal paths, those of the corresponding signal path of the second subset. The offsets are determined based on differences between the calibration results of the signal path of the second subset and its proxy in the first subset. For subsequent calibrations in the first performance state, the signal paths of the second subset are not directly calibrated. Instead, the calibration results of their corresponding proxies in the first subset are combined with the calculated offsets to arrive at calibration results for signal paths of the second subset.

Method 500 further includes performing a second calibration of the first and second subsets of signal paths while operating in a second performance state (block 515). The second performance state may differ from the first in terms of clock frequency, operating voltage, or both. As with the first calibration, the second calibration is an initial calibration performed in that particular performance state. For a signal path of the second subset, Method 500 further includes selecting a second proxy signal path from the first subset for subsequent calibrations in the second performance state, based on the calibration results, and determining offsets (block 520). This may be performed in the same manner as in the initial calibration performed in the first performance state. Thereafter, selected signal paths of the first subset may act as proxies for corresponding signal paths of the second subset, in lieu of direct calibration of the latter.

It is noted that, for a given signal path of the second subset, a different proxy signal path may be selected for each of the first and second performance states. Referring briefly back to FIG. 1 for example, signal path 9 may have a proxy of signal path 0 for subsequent calibrations performed in the first performance state, while having a proxy of signal path 4 for subsequent calibrations performed in the second performance state.

Generally speaking, in response to information obtained during an initial calibration in a given performance state, selection of the proxy signal path for the particular one of the second subset of signal paths is based on a difference in respective eye patterns of various ones of the first subset of signal paths and the particular one of the second subset of signal paths.

With regard to the difference in calibration results between a signal path of the second subset and its proxy in the first subset, the difference may be considered a difference in respective eye patterns. Determining this difference thus includes determining voltage offsets and timing offsets. The memory controller that carries out the calibration, in response to performing an instance of the subsequent calibration, determines updated eye pattern for the particular one of the second subset of signal paths by combining the voltage and timing offsets with the respective updated eye pattern of the proxy signal path.

Since limitations of some embodiments may inhibit a memory controller from calibrating all signal paths in a single pass, the memory controller may thus perform the initial calibration in a first pass to determine respective eye patterns for signal paths of the first subset and in a second pass to determine respective eye patterns for signal paths in the second subset. Thereafter, using various ones of the signal paths of the first subset as proxies for signal paths of the second subset, the memory controller performs instances of the subsequent calibration in a single pass.

Figure 6:
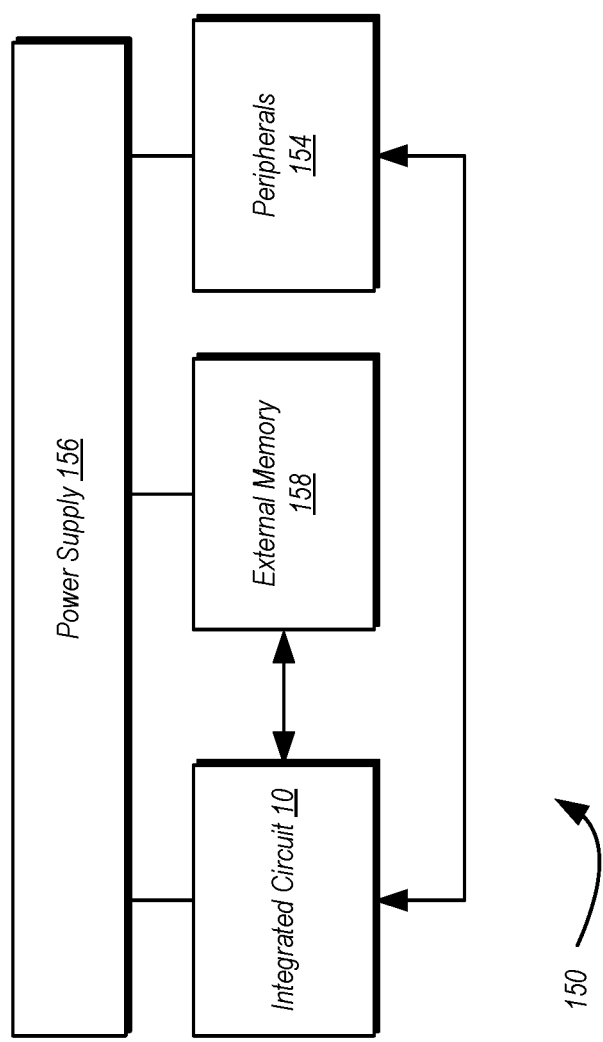
FIG. 6 is a block diagram of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments of system 150, a memory controller (e.g., implemented in IC 10) and a memory (e.g., external memory 158) may conform to various ones of the apparatus embodiments discussed above. Such embodiments may also be capable of carrying out various embodiments of the methods discussed above. IC 10 may also include other circuitry disclosed herein, such as PMU 108 and voltage regulator 111 as shown in FIG. 2.

Numerous variations and modifications will become apparent to those skilled in the art once the above disclosure is fully appreciated. It is intended that the following claims be interpreted to embrace all such variations and modifications.

What is claimed is:

1. An apparatus, comprising:
 a memory;
 a memory controller coupled to the memory by a set of signal paths, wherein the memory controller is configured to:
  perform an initial calibration that includes:
   activating each of the set of signal paths to determine respective eye patterns for signal paths in the set;
  perform a subsequent calibration that includes:
   activating a subset of the set of signal paths to determine updated respective eye patterns for signal paths in the subset;
   for remaining ones of the set of signal paths, determining respective updated eye patterns, wherein the determining is based on information obtained during the initial calibration and is performed without activating the remaining ones of the set of signal paths.

2. The apparatus of claim 1, wherein the information obtained during the initial calibration includes, for the remaining ones of the set of signal paths, voltage and timing offsets relative to corresponding selected ones of the subset of the set of signal paths.

3. The apparatus of claim 2, wherein the memory controller is configured to determine, during the initial calibration, a one of the subset of signal paths having an eye pattern most closely matching an eye pattern of a selected one of the remaining ones of the set of signal paths, and further configured to determine the voltage and timing offsets based on differences in the eye pattern of the one of the subset of signal paths and the eye pattern of a selected one of the remaining ones of the set of signal paths.

4. The apparatus of claim 1, wherein, in performing the initial calibration, the memory controller is configured to:
 perform a first calibration pass to determine respective eye patterns for signal paths in the subset;
 perform a second calibration pass to determine a respective eye pattern for at least one of the remaining ones of the set of signal paths.

5. The apparatus of claim 1, wherein the memory controller is configured to, for one of the remaining ones of the set of signal paths:
 select a first one of the subset of signals paths as a basis for determining an eye pattern for subsequent calibrations conducted at a first clock frequency; and
 select a second one of the subset of signal paths as a basis for determining an eye pattern for subsequent calibrations conducted at a second clock frequency.

6. The apparatus of claim 1, wherein the memory controller is configured to perform the initial calibration during a startup of a system in which the memory controller and the memory are implemented, and further configured to perform one or more instances of the subsequent calibration during operation of the system.

7. The apparatus of claim 1, wherein the memory controller is configured to, in performing the initial calibration and the subsequent calibration:
 perform one or more writes of data to the memory; and
 perform one or more reads of data from the memory.

8. The apparatus of claim 1, wherein performing the initial calibration and the subsequent calibration, the memory controller is configured to determine, for a given one of the set of signal paths:
 a voltage at which signals conveyed on ones of the set of signal paths are used to distinguish a logic one from a logic zero; and
 a time at which signals conveyed on ones of the set of signal paths are sampled in accordance with a data strobe signal.

9. A method, comprising:
 performing, in a memory subsystem having a memory controller coupled to a memory by a set of signal paths, an initial calibration, wherein performing the initial calibration includes:
  activating each of the set of signal paths to determine respective eye patterns for signal paths in the set;
 performing a subsequent calibration, wherein performing the subsequent calibration includes:
  activating a subset of the set of signal paths to determine updated respective eye patterns for signal paths in the subset;
  for remaining ones of the set of signal paths, determining respective updated eye patterns, wherein the determining is based on information obtained during the initial calibration and is performed without activating the remaining ones of the set of signal paths.

10. The method of claim 9, wherein the information obtained during the initial calibration includes voltage and timing offsets between a one of the remaining ones of the set of signal paths and one of the subset of the set of signal paths having an eye pattern that most closely matches an eye pattern of the one of the remaining ones of the set of signal paths.

11. The method of claim 10, further comprising:
 determining, during the subsequent calibration, the updated respective eye pattern for the one of the subset of the set of signal paths; and
 computing the respective updated eye pattern for the one of the remaining ones of the set of signal paths by applying the voltage and timing offsets to the updated respective eye pattern for the one of the subset of the set of signal paths.

12. The method of claim 9, wherein performing the initial calibration comprises calibrating the subset of signal paths during a first pass and calibrating at least one remaining one of the set of signal paths during a second pass, and wherein performing the subsequent calibration comprises a single pass in which the signal paths of the subset of signal paths are calibrated.

13. The method of claim 9, further comprising:

for a subsequent calibration conducted at a first clock frequency, selecting calibration information for a first one of the subset of signal paths as a basis for determining an a first updated eye pattern for a selected one of the remaining ones of the signal paths; and for a subsequent calibration conducted as a second clock frequency different from the first clock frequency, selecting calibration information for a second one of the subset of signal paths as a basis for determining a second updated eye pattern for the selected one of the remaining ones of the signal paths.

14. The method of claim 9, further comprising:

performing the initial calibration during a startup of a system implementing the memory subsystem;

performing one or more instances of the subsequent calibration on a periodic basis; and performing an instance of the subsequent calibration in response to a performance state change.

15. A system comprising:

a memory;

a memory controller coupled to the memory by a plurality of signal paths including first and second subsets of signal paths, wherein the memory controller is configured to:

perform an initial calibration to determine respective eye patterns associated with each of the first and second subsets of signal paths;

select, for a particular one of the second subset of signal paths, a corresponding one of the first subset of signal paths as a proxy signal path;

perform one or more instances of a subsequent calibration, wherein the a given one of the one or more instances of the subsequent calibration includes:

activating the first subset of signal paths to determine a first set of updated respective eye patterns;

determining an updated eye pattern for the particular one of the second subset of signals paths based on an updated respective eye pattern of the proxy signal path.

16. The system of claim 15, wherein the memory controller is configured to, in response to information obtained during the initial calibration, select the proxy signal path for the particular one of the second subset of signals paths based on a difference in respective eye patterns of various ones of the first subset of signal paths and the particular one of the second subset of signal paths.

17. The system of claim 16, wherein the difference in respective eye patterns includes determining voltage offsets and timing offsets, and wherein the memory controller is configured to, in response to performing an instance of the subsequent calibration, determine updated eye pattern for the particular one of the second subset of signals paths by combining the voltage and timing offsets with the respective updated eye pattern of the proxy signal path.

18. The system of claim 15, wherein the memory controller is configured to periodically perform instances of the subsequent calibration, and further configured to perform an instance of the subsequent calibration in response to a performance state change.

19. The system of claim 15, wherein the memory controller is further configured to:

perform a portion of the initial calibration in a first performance state;

select, for the particular one of the second subset of signals paths, a first proxy path based on results obtained from the initial calibration in the first performance state;

perform a portion of the initial calibration in a second performance state; and select, for the particular one of the second subset of signals paths, a second proxy path based on results obtained from the initial calibration in the second performance state.

20. The system of claim 15, wherein the memory controller is further configured:

to perform the initial calibration in a first pass to determine respective eye patterns for signal paths of the first subset and in a second pass to determine respective eye patterns for signal paths in the second subset;

perform instances of the subsequent calibration in a single pass.

* * * * *